United States Patent
Nakamura et al.

(12)

(10) Patent No.: US 6,376,373 B1
(45) Date of Patent: Apr. 23, 2002

(54) METHOD OF MANUFACTURING A SEMICONDUCTOR DEVICE

(75) Inventors: Kikuko Nakamura, Yao; Tatsuo Sugiyama, Osaka; Shinichi Ogawa, Neyagawa, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/523,985

(22) Filed: Mar. 13, 2000

(30) Foreign Application Priority Data

Mar. 18, 1999 (JP) .......................... 11-072845

(51) Int. Cl.⁷ .............................. H01L 21/44
(52) U.S. Cl. .................. 438/683; 438/587; 438/597; 438/682
(58) Field of Search .................. 438/683, 597, 438/585, 584, 682, 586, 587, 592, 649

(56) References Cited

U.S. PATENT DOCUMENTS 5,563,100 A * 10/1996 Matsubara .................. 438/683
5,876,796 A * 3/1999 Regolini et al. ............ 438/683

OTHER PUBLICATIONS

"Effects of Recoil Argon Atoms in Filling Holes in Long Throw Sputter Deposition," from Ulvac Technical Journal, No. 47, 1997, pp. 35–38, with translation.

* cited by examiner

*Primary Examiner*—Charles Bowers
*Assistant Examiner*—Yennhu B. Huynh
(74) *Attorney, Agent, or Firm*—Stevens, Davis, Miller & Mosher, LLP

(57) ABSTRACT

While conventionally, a Co film is deposited by directional sputtering directly on a source/drain diffusion layer formed on the surface of an Si substrate while the substrate is being heated, a thin oxide film is formed on the source/drain diffusion layer and then, the Co film is deposited by directional sputtering while the substrate is being heated. By doing this, an inner Co—Si layer the composition of which is thermally unstable is formed and a Co—Si—O layer is formed on the Co—Si layer. After the remaining unreacted Co film and the Co—Si—O layer are selectively removed, a high-temperature heat treatment is performed, so that the inner Co—Si layer is transformed into a $CoSi_2$ layer to increase the film thickness. The formation of the oxide film curbs the speed of reaction between Co and Si, so that a Co—Si layer of the same thickness as that in the wide region can be formed in the fine region. As a result, a $CoSi_2$ layer with uniform thickness and sheet resistance can be formed.

11 Claims, 5 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device in which a silicide layer is formed, for example, on a source/drain diffusion layer or the like of a MOS (metal oxide semiconductor) transistor.

2. Description of the Related Art

As semiconductor integrated circuit pattern become finer, it is required to develop a transistor forming technology called a salicide structure with which both the gate electrode and the source/drain diffusion layer of a MOS transistor can be made low-resistance electrodes. For example, a Co salicide structure is formed by a directional sputtering of Co such as "long-throw sputtering" in which a metal film is formed with a distance between the metal material target and the semiconductor substrate (refer, for example, to *Ulvac Technical Journal* Vol. 47 (1997), p.35). By applying this directional sputtering to the manufacture of a CMOS logic device, a Co film with comparatively excellent coverage can be deposited even in a narrow diffusion layer region between gate electrodes and at the same time, Co of substantially the same thickness can be deposited both in a wide region and in a narrow region, so that a low-resistance Co silicide layer having the same sheet resistance in both of the regions can be formed.

A conventional case where a Co film is deposited by directional sputtering will be described with reference to FIGS. 2A and 2B. As shown in FIG. 2A, source/drain diffusion layers 3 isolated by device isolating portions 2 are present on an Si substrate 1, and between the diffusion layers 3, polysilicon gate electrodes 5, 6, 7 and 8 with a height of 0.2 μm are formed, with gate oxide films 4 in between, so as to be sandwiched by side walls 9 comprising insulating films. In this example, the distance between the gate electrodes 5 and 6 is, for example, 1.0 μm, and the distance between the gate electrodes 7 and 8 is 0.5 μm. On this structure, a Co film 10 with a thickness of 10 nm is deposited by directional sputtering (FIG. 2B). In this directional sputtering, Co atoms from a Co target bombarded by Ar plasma are made substantially vertically incident on the Si substrate 1 so as to be deposited thereon, and as shown in FIG. 2B, a Co film 10 is formed that is approximately 9 nm thick in a central part A of a narrow region sandwiched by the gate electrodes 7 and 8, and approximately 8 nm thick in a peripheral part B of the narrow region. FIG. 2B shows only a part in the vicinity of the polysilicon gate electrode 7 and 8.

By performing a heat treatment in a postprocess, the Co film 10 deposited by this directional sputtering is caused to react with the Si substrate 1, thereby forming a Co silicide layer on the Si substrate 1. The silicide layer has a substantially uniform thickness irrespective of the distance between the gate electrodes as long as the distance is approximately 0.5 μm. Thus, a silicide layer having a uniform sheet resistance at least within the chip can be formed.

However, when the distance between the polysilicon gate electrodes 7 and 8 is reduced to approximately 0.2 μm, the region between the gate electrodes 7 and 8 is approximately 0.2 μm in depth and approximately 0.2 μm in width, so that the aspect ratio increases. Consequently, according to the above-described conventional method, even if the Co film is deposited by directional sputtering with 10 nm as the target thickness, the deposited Co film is only approximately 6 nm thick even at the thickest portion in the central part, whereas in the part where the distance between the gate electrodes is large, the Co film 10 is deposited substantially to the target thickness 10 nm. When the Co film is transformed into a silicide film by heat-treating such a specimen, a silicide layer is formed in which the thickness and the sheet resistance largely differ between the part where the distance between the polysilicon gate electrodes is large and the part where the distance is small (that is, the wide region and the narrow region) according to the difference in the thickness of the deposited Co film.

When such a Co silicide layer in which the thickness and the sheet resistance largely differ is formed, in etching to form a contact hole in an interlayer dielectric film formed on the Co silicide layer in the postprocess, a bottom of the contact hole passes through the Co silicide layer to reach the diffusion layer situated therebelow because of overetching in the part where the distance between the polysilicon gate electrodes is small. Consequently, the contact resistance increases. In addition, the operation speed varies among local circuits on a chip due to difference in diffusion layer resistance between the part where the distance between the polysilicon gate electrodes is large and the part where the distance is small. As described above, because of the increase in contact resistance in the part where the distance between the polysilicon gate electrodes is small and the variation in operation speed among local circuits, finished semiconductor devices become faulty, which deteriorates the manufacturing yield.

Moreover, increasing the thickness of the deposited Co film in the part where the distance between the polysilicon gate electrodes is small to the target thickness increases the thickness of the deposited Co film in the part where the distance between the polysilicon gate electrodes is large to be larger than the target thickness, so that the thickness of the $CoSi_2$ film formed in the part increases to increase the p-n junction leakage current in this part. Consequently, finished semiconductor devices become faulty, which deteriorates the manufacturing yield.

To improve the coverage of Co film in the part where the distance between the gate electrodes is small, it is considered to deposit Co by the CVD (chemical-vapor deposition) method. However, no industrial CVD method for depositing Co is present at the moment.

SUMMARY OF THE INVENTION

An object of the present invention is to provide a method of manufacturing a semiconductor device, with which a silicide layer having the same thickness and sheet resistance as in the wide region with excellent metal coverage can be formed in the fine region having inferior coverage when the conventional manufacturing method is applied.

A method of manufacturing a semiconductor device of the present invention comprises the steps of: forming an oxide film on a semiconductor substrate; depositing a metal on the oxide film, and forming a reaction layer resulting from a reaction of the metal with a surficial portion of the semiconductor substrate through the oxide film; and removing the residual metal which has not reacted and the oxide film and then, transforming the reaction layer into a silicide layer by a high-temperature heat treatment.

According to the present invention, the oxide film is formed on the semiconductor substrate and the metal is deposited thereon, and the presence of the oxide film curbs the speed of reaction between the metal and the semiconductor substrate, so that a reaction layer of the same thickness as that in the wide region with excellent metal coverage can be formed in the fine region with inferior coverage. As a result, a silicide layer having the same thickness and sheet resistance in the fine region and in the wide region can be formed. By the substrate heating condition or the like in the metal deposition, not only the thickness of the reaction layer can be controlled but also the thickness of the silicide layer can be controlled.

Moreover, by forming a plurality of gate electrodes on a semiconductor substrate with a gate insulating film in between, forming a source/drain diffusion layer on a surface of the semiconductor substrate which surface is sandwiched between the gate electrodes, and forming an oxide film, a reaction layer and a silicide layer on the source/drain diffusion layer, a silicide layer of the same thickness and sheet resistance can be formed in a source/drain diffusion layer which is a fine region sandwiched between the gate electrodes and in a source/drain diffusion layer which is a wide region, and the source/drain diffusion layer can be uniformly made a low-resistance layer irrespective of the width of the region.

Moreover, in the step of forming the reaction layer, it is preferable to deposit the metal while heating the semiconductor substrate.

Moreover, it is preferable that the thickness of the oxide film be 0.1 to 1 nm.

Moreover, it is preferable to deposit the metal by directional sputtering.

Moreover, it is preferable that the metal be a refractory metal. As the refractory metal, Co, Ta, Ni, Mo, Zr or Ti may be used.

DESCRIPTION OF THE PREFERRED EMBODIMENT

Figure 1A:
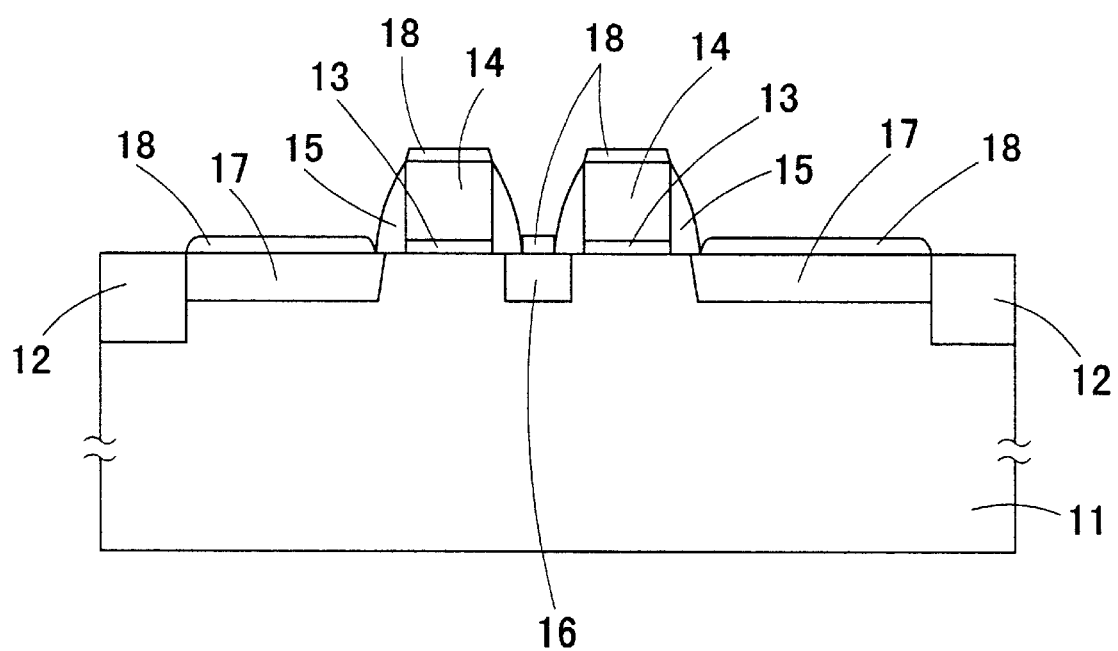
FIGS. 1A to 1C are process cross-sectional views showing a method of manufacturing a semiconductor device according to an embodiment of the present invention.
Figure 1B:
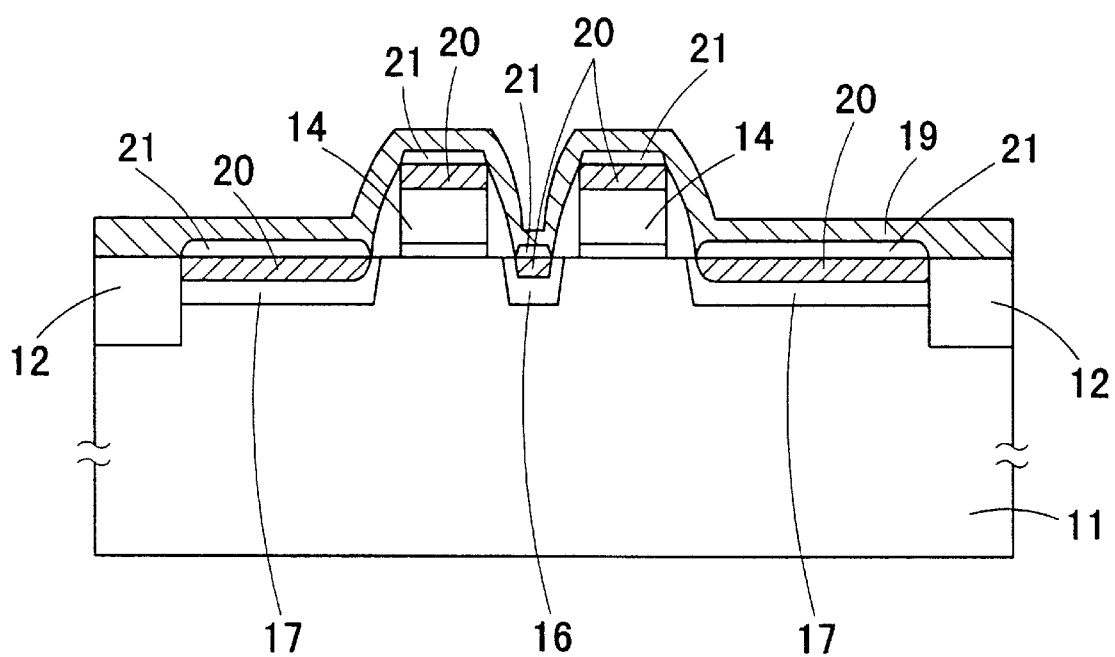
Figure 1C:
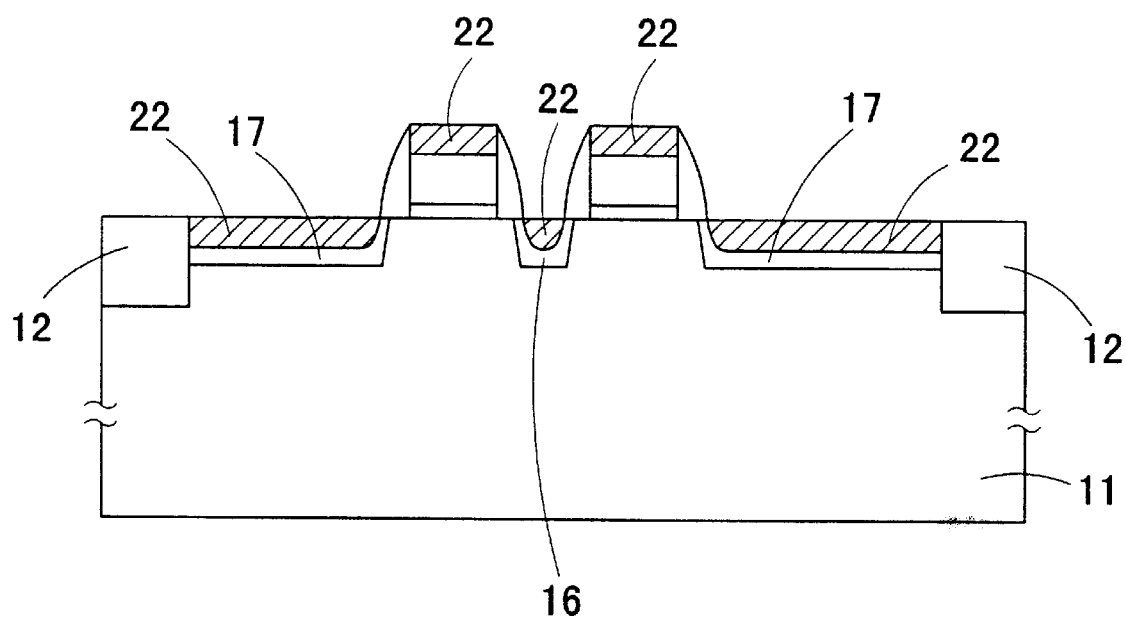
Figure 2A:
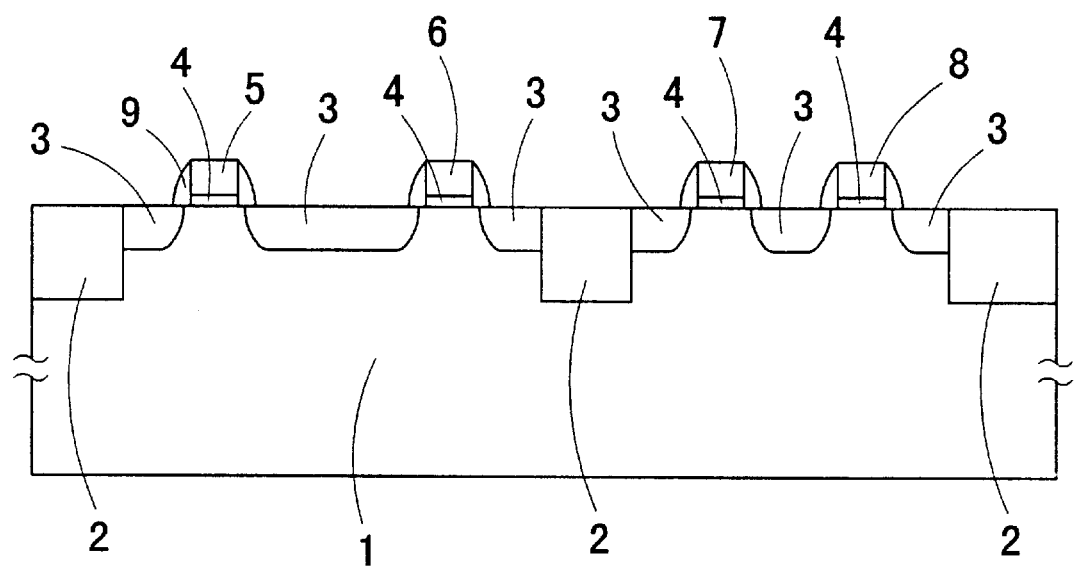
FIGS. 2A and 2B are process cross-sectional views showing the conventional method of manufacturing a semiconductor device.
Figure 2B:
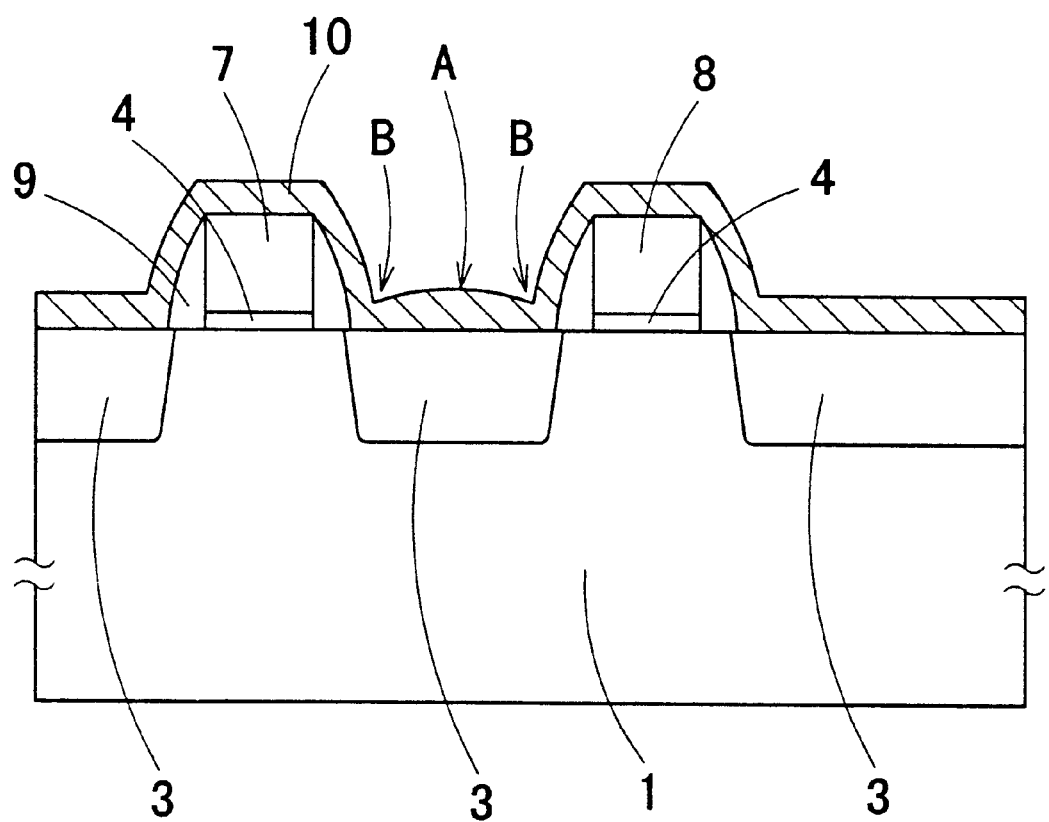

An embodiment of the present invention will be described with reference to the drawings. FIGS. 1A to 1C are process cross-sectional views showing a method-of manufacturing a semiconductor device according to the embodiment of the present invention. In these figures, of the parts where a plurality of MOS transistors are formed, a part where the distance between the gate electrodes is small is shown.

First, as shown in FIG. 1A, on an Si substrate (semiconductor substrate) 11 where a device isolating portion 12 comprising a thick insulating film is formed, a gate oxide film 13, a polysilicon gate electrode 14 and a side wall 15 are formed, and then, source/drain diffusion layers 16 and 17 are formed. The source/drain diffusion layer 16 is a fine region with a width of not more than 0.2 µm, the source/drain diffusion layer 17 is a wide region with a width of more than 0.2 µm, and the surface of the Si substrate 11 is exposed. The surfaces of the source/drain layers 16 and 17 of this substrate are purified with a mixture of hydrofluoric acid and water (mixture ratio in volume 1:100). Then, the substrate is soaked in a 80-° C.-mixture of ammonia, oxygenated water and water (mixture ratio in volume 1:1:8) for ten minutes, thereby forming a 0.7-nm-thick oxide film 18 on the surfaces of the source/drain diffusion layers 16 and 17 and the surface of the polysilicon gate electrode 14.

Then, as shown in FIG. 1B, Co is deposited to a thickness of 20 nm by directional sputtering at a substrate temperature of 200° C. to form a Co film 19. In most cases, it is necessary to heat the substrate when Co is deposited in order to clean the interface by removing the moisture adhering to the surface of the substrate in the above-described cleaning so that the reaction between Co and Si is uniform. However, when the adhering moisture is negligible, it is possible to perform a heat treatment at approximately 200° C. after depositing Co in the vicinity of room temperature. However, it is preferable to deposit Co while heating the substrate.

When Co is deposited at the substrate temperature 200° C., during the deposition, Co of an amount corresponding to a thickness of approximately 5 nm penetrates through the thin oxide film 18 to react with Si of the Si substrate 11, so that a Co—Si layer (reaction layer) 20 the composition of which is thermally unstable is formed in a thickness of approximately 5 nm. Simultaneously therewith, the oxide film 18 reacts with Co to form a Co—Si—O layer 21. A similar reaction occurs on the surface of the polysilicon gate electrode 14. With respect to the Co film 19 deposited on the device isolating portion 12 and the side wall 15, since the device isolating portion 12 and the side wall 15 normally comprise Si oxide films, a layer made of Co—Si—O is formed during the deposition of the Co film 19 like on the surfaces of the source/drain diffusion layers 16 and 17. However, since there is no Si like Si substrate 11 to react with, most part remains as the Co film 19 being unreacted. When a heat treatment is performed at approximately 200° C. after Co is deposited in the vicinity of room temperature, the above-mentioned reactions occur at the time of the heat treatment.

Thereafter, only the remaining unreacted Co film 19 and the Co—Si—O layer 21 are selectively removed by use of a mixture of ammonia, oxygenated water and water (mixture ratio in volume 1:1:8, 80° C.). Then, the Co—Si layer 20 remains on the source/drain diffusion layers 16 and 17 and on the polysilicon gate electrode 14. This is heat-treated, for example, at 800° C. for 30 seconds to form a $CoSi_2$ layer (silicide layer) 22 being approximately 10 nm in thickness and thermally stable which layer 22 is the final product (FIG. 1C). At this time, the crystalline structure changes when the Co—Si layer 20 is transformed into the $CoSi_2$ layer 22 by the high-temperature heat treatment. Because of this, the volume expands to increase the film thickness from approximately 5 nm to approximately 10 nm.

As described above, according to this embodiment, the thin oxide film 18 being, for example, 0.7 nm in thickness is formed on the surfaces of the source/drain diffusion layers 16 and 17, and on the film 18, the Co film 19 is deposited to a thickness (20 nm) considerably larger than the thickness (5 nm) of Co consumed by the reactions occurring during the deposition.

During the deposition of Co by sputtering, the polysilicon gate electrode 14 acts as a obstacle that inhibits Co atoms from reaching to the surfaces of the source/drain diffusion layers 16 and 17. However, by depositing the Co film 19 so as to be thick, a Co film enough for forming the $CoSi_2$ layer 22 of the target thickness is formed not only on the comparatively wide diffusion layer 17 of a different size surrounded by the polysilicon gate electrode 14 but also on the extremely narrow diffusion layer 16.

According to the conventional method in which the Co film is deposited so as to be directly in contact with the surfaces of the source/drain diffusion layers while the substrate is being heated, Co and Si react extremely quickly even if the substrate heating temperature is as low as 200° C., so that almost all of the deposited Co reacts. Therefore, it is necessary to control the thickness of the Co—Si layer by the thickness of the firstly deposited Co film. By such a method, it cannot be helped that the film thickness differs between the wide source/drain diffusion layer and the narrow source/drain diffusion layer, so that only a $CoSi_2$ film that differs in thickness can be formed.

On the contrary, according to this embodiment, first, the thin oxide film 18 is positively formed, which curbs the speed of reaction between Co and Si during the deposition performed while heating the substrate. This enables the thickness of the formed Co—Si layer 20 to be controlled by the time of the substrate heating during the deposition by sputtering. For example, the substrate heating time is decided in correspondence with the thickness of the oxide film 18 and the thickness of the formed Co—Si layer 20. Since the thickness of the Co—Si layer 20 can be controlled in this manner, it is possible that the deposited Co film 19 be sufficiently thick, so that the Co—Si layer 20 of the same thickness can be formed on the surfaces of the source/drain diffusion layers 16 and 17 having different widths. As a result, the $CoSi_2$ layer 22 of the same thickness being targeted can be formed on the surfaces of the source/drain diffusion layers 16 and 17 having different widths. Therefore, a diffusion layer having a sheet resistance with little variation can be formed in all the regions. For this reason, the conventional problem that the operation speed varies among local circuits due to difference in diffusion layer resistance can be avoided.

Moreover, the conventional problem does not arise that because of overetching in forming a contact hole in the interlayer dielectric film formed on the $CoSi_2$ layer in the postprocess, the bottom of contact hole passes through the $CoSi_2$ layer in the fine region where the $CoSi_2$ layer is thin.

Moreover, the following conventional problem can be also avoided: increasing the thickness of the deposited Co film in the fine region increases the thickness of the deposited Co film in the wide region, which increases the thickness of the $CoSi_2$ film formed in the wide region to increase the p-n junction leakage current in this region.

As a result of these, the manufacturing yield of the semiconductor device can be improved.

While the thickness of the oxide film 18 is 0.7 nm in this embodiment, for example, the amount of Co that reacts with Si can be controlled by controlling the time for which the substrate is soaked in the mixture of ammonia oxygenated water and water so that the thickness of the oxide film 18 is 0.1 nm (the soaking time, approximately 30 seconds) to 1 nm (the soaking time, approximately 20 minutes). The oxide film 18 may be formed by another method that can control the thickness between 0.1 and 1 nm, for example, the CVD method. When the thickness of the oxide film 18 is less than 0.1 nm, there are cases where the speed of reaction between Co and Si cannot be controlled during the deposition of Co while heating the substrate, and when the thickness exceeds 1 nm, there are cases where the ability to curb the reaction between Co and Si is so high that the Co—Si layer 20 of FIG. 1B is not formed.

It is to be noted that the amount of reaction between Si and Co can be controlled by controlling the Co deposition temperature. For example, while in the above-described embodiment, the Co—Si layer 20 being approximately 5 nm in thickness is formed at a deposition temperature (substrate temperature) of 200° C., when the deposition temperature is 300° C., a Co—Si layer 20 being approximately 7 nm in thickness is formed during the deposition.

While Co is deposited to a film thickness of 20 nm, Co may be deposited to any thickness that is larger than the Co film thickness consumed by the reactions occurring during the deposition (approximately 5 nm at the above-mentioned deposition temperature 200° C.).

While Co is used as the metal used for forming the silicide layer in the above-described embodiment, it is to be noted that the same effect is obtained when another refractory metal used for the salicide process such as Ta, Ni, Mo, Zr or Ti is used.

What is claimed is:

1. A method of manufacturing a semiconductor device, comprising the steps of:
   forming an oxide film on a semiconductor substrate by use of a predetermined oxide film forming means, wherein said oxide film is not a naturally oxidized film;
   depositing a metal on said oxide film, and forming a reaction layer resulting from a reaction of said metal with a surficial portion of said semiconductor substrate through said oxide film; and
   removing (i) remaining unreacted portions of said metal and (ii) said oxide film and then, transforming said reaction layer into a silicide layer by a high-temperature heat treatment.

2. A method of manufacturing a semiconductor device according to claim 1, wherein in said step of forming said reaction layer, said metal is deposited while said semiconductor substrate is being heated.

3. A method of manufacturing a semiconductor device according to claim 1, wherein a thickness of said oxide film is 0.1 to 1 nm.

4. A method of manufacturing a semiconductor device according to claim 2, wherein a thickness of said oxide film is 0.1 to 1 nm.

5. A method of manufacturing a semiconductor device, comprising the steps of:
   forming a plurality of gate electrodes on a semiconductor substrate with a gate insulating film in between;
   forming a source/drain diffusion layer on a surface of said semiconductor substrate which surface is sandwiched between said gate electrodes;
   forming an oxide film on said source/drain diffusion layer by use of predetermined oxide means, wherein said oxide film is not a naturally oxidized film;
   depositing a metal on said oxide film, and forming a reaction layer resulting from a reaction of said metal with a surficial portion of said source/drain diffusion layer through said oxide film; and
   removing (i) remaining unreacted portions of said metal and (ii) said oxide film and then, transforming said reaction layer into a silicide layer by a high-temperature heat treatment.

6. A method of manufacturing a semiconductor device according to claim 5, wherein in said step of forming said reaction layer, said metal is deposited while said semiconductor substrate is being heated.

7. A method of manufacturing a semiconductor device according to claim 5, wherein a thickness of said oxide film is 0.1 to 1 nm.

8. A method of manufacturing a semiconductor device according to claim 6, wherein a thickness of said oxide film is 0.1 to 1 nm.

9. A method of manufacturing a semiconductor device according to claim 1, 2, 3, 4, 5, 6, 7 or 8, wherein said metal is deposited by directional sputtering.

10. A method of manufacturing a semiconductor device according to claim 1, 2, 3, 4, 5, 6, 7 or 8, wherein said metal is a refractory metal.

11. A method of manufacturing a semiconductor device according to claim 10, wherein said refractory metal is cobalt, tantalum, nickel, molybdenum, zirconium or titanium.

* * * * *